US010299405B2

(12) United States Patent
Chang et al.

(10) Patent No.: US 10,299,405 B2
(45) Date of Patent: May 21, 2019

(54) MID-SPREADER FOR STACKED CIRCUIT BOARDS IN AN ELECTRONIC DEVICE

(71) Applicant: Plume Design, Inc., Palo Alto, CA (US)

(72) Inventors: Richard Tzewei Chang, Sunnyvale, CA (US); Yoseph Malkin, San Jose, CA (US); Patrick Hanley, San Mateo, CA (US); Jeffrey ChiFai Liew, Millbrae, CA (US); Liem Hieu Dinh Vo, San Jose, CA (US); Duc Minh Nguyen, San Jose, CA (US); Nora Yan, San Mateo, CA (US); Hiroshi Mendoza, Copenhagen (DK); William McFarland, Portola Valley, CA (US)

(73) Assignee: Plume Design, Inc., Palo Alto, CA (US)

( * ) Notice: Subject to any disclaimer, the term of this patent is extended or adjusted under 35 U.S.C. 154(b) by 0 days.

(21) Appl. No.: 15/722,035

(22) Filed: Oct. 2, 2017

(65) Prior Publication Data

US 2019/0104640 A1   Apr. 4, 2019

(51) Int. Cl.
H05K 7/20 (2006.01)
H05K 1/14 (2006.01)
H05K 1/11 (2006.01)

(52) U.S. Cl.
CPC ......... H05K 7/20209 (2013.01); H05K 1/115 (2013.01); H05K 1/144 (2013.01)

(58) Field of Classification Search
CPC ....... H05K 1/0203; H05K 2201/10106; H05K 1/141; H05K 7/20436; H05K 7/20409; H05K 7/20418; H05K 9/0007; H05K 5/0217; H05K 3/0061; H05K 1/0215; H05K 1/0204; H05K 2201/066; H05K 1/181; H05K 1/0209; H05K 1/021; H05K 7/2039; H05K 7/209; H05K 1/115; H05K 1/144; H05K 7/20209; F21V 29/70; F21V 29/773; F21V 29/004; G06F 1/183; G06F 1/20

See application file for complete search history.

(56) References Cited

U.S. PATENT DOCUMENTS

| 10,076,059 | B2 * | 9/2018 | Kim ..................... H05K 1/0204 |
| 10,103,692 | B2 * | 10/2018 | Patel ..................... H01L 23/427 |
| 2003/0139071 | A1 * | 7/2003 | Li ......................... H01L 23/367 439/66 |
| 2004/0212964 | A1 * | 10/2004 | Belady ................... H01L 23/36 361/704 |

(Continued)

Primary Examiner — Adam B Dravininkas
(74) Attorney, Agent, or Firm — Clements Bernard Walker PLLC; Lawrence A. Baratta, Jr.

(57) ABSTRACT

An electronic device includes a first circuit board and a second circuit board each stacked relative to one another; and a mid-spreader disposed between the first circuit board and the second circuit board, wherein the mid-spreader includes a heat conductive material in thermal contact with one or more components on each of the first circuit board and the second circuit board to act as a heat sink, and wherein the mid-spreader is thermally connected to one or more heat sinks, the mid-spreader is one of disposed to or integrally formed with the one or more heat sinks, and the mid-spreader extends beyond a size of at least one of the first circuit board and the second circuit board to conduct and transfer heat therefrom.

17 Claims, 4 Drawing Sheets

(56) References Cited

U.S. PATENT DOCUMENTS

| | | | | |
|---|---|---|---|---|
| 2004/0218361 A1* | 11/2004 | Lin | ............ | H05K 1/144 |
| | | | | 361/695 |
| 2004/0218367 A1* | 11/2004 | Lin | ............ | H05K 1/144 |
| | | | | 361/721 |
| 2004/0246678 A1* | 12/2004 | Lin | ............ | H01L 23/467 |
| | | | | 361/697 |
| 2006/0050492 A1* | 3/2006 | Goodwin | ............ | G11C 5/04 |
| | | | | 361/767 |
| 2007/0177348 A1* | 8/2007 | Kehret | ............ | H05K 7/1434 |
| | | | | 361/690 |
| 2010/0091464 A1* | 4/2010 | Ohnishi | ............ | H01L 23/053 |
| | | | | 361/723 |
| 2012/0300405 A1* | 11/2012 | Weeber | ............ | H01L 23/552 |
| | | | | 361/709 |
| 2014/0078677 A1* | 3/2014 | Dolci | ............ | H01L 23/10 |
| | | | | 361/719 |
| 2015/0260390 A1* | 9/2015 | Bretschneider | ..... | F21V 19/0055 |
| | | | | 362/294 |

\* cited by examiner

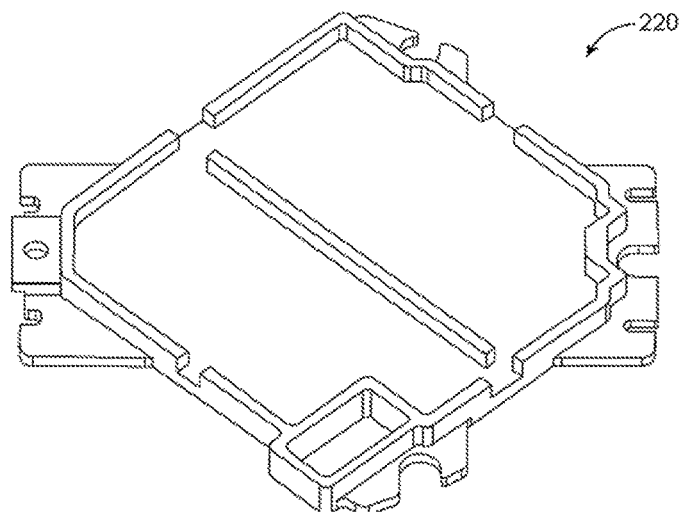
*FIG. 4*
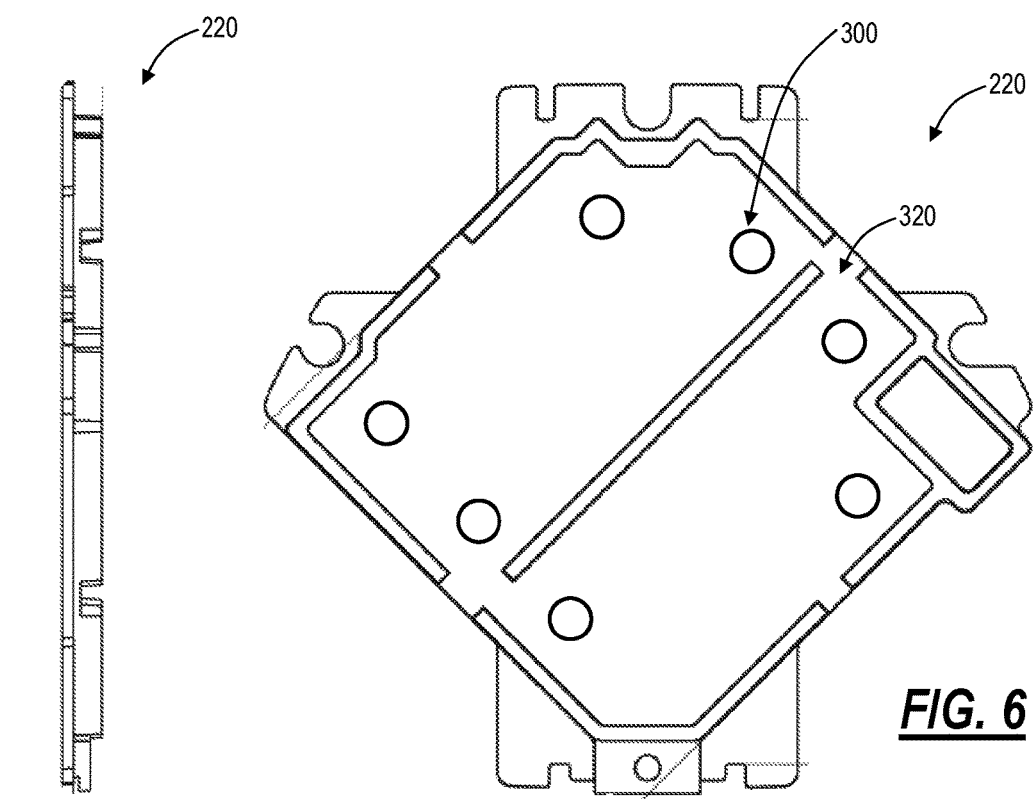
*FIG. 5*
*FIG. 6*

MID-SPREADER FOR STACKED CIRCUIT BOARDS IN AN ELECTRONIC DEVICE

FIELD OF THE DISCLOSURE

The present disclosure generally relates to electronic hardware systems and methods. More particularly, the present disclosure relates to a mid-spreader for stacked circuit boards in an electronic device, such as a Wi-Fi Access Point (AP).

BACKGROUND OF THE DISCLOSURE

The trend in consumer electronic design and the like is for aesthetically pleasing hardware form factors in a small and compact manner. For example, distributed Wi-Fi systems in which a number of Wi-Fi APs are distributed around a location such as a residence are becoming more popular. However, placing a number of APs around a house puts additional pressure on making the APs small and attractive (e.g., unique industrial design). Such small APs, with an unusual industrial design, raise four challenging issues as follows. First, to fit all the required circuitry requires two or more Printed Circuit Boards (PCBs) to be stacked. Second, the close proximity of the PCBs may cause significant Electro-Magnetic Interference (EMI) that degrades performance. Third, the small surface area and tightly packed components make it difficult to maintain component temperatures which are within the approved operating range. Fourth, the small size may not leave sufficient space for a mechanically strong chassis on which the PCBs and other mechanical components can be secured.

The use of heat sinks to conduct heat away from components, thereby reducing their operating temperature is well known. Similarly, the use of metal enclosures (often referred to as "cans") to provide EMI shielding is well known. However, if one designs a product using traditional heat sinks, traditional EMI enclosures, and a traditional mechanical chassis, the design will be physically large.

BRIEF SUMMARY OF THE DISCLOSURE

In an exemplary embodiment, an electronic device includes a first circuit board and a second circuit board each stacked relative to one another; and a mid-spreader disposed between the first circuit board and the second circuit board, wherein the mid-spreader includes a heat conductive material in thermal contact with one or more components on each of the first circuit board and the second circuit board to act as a heat sink, and wherein the mid-spreader is thermally connected to one or more heat sinks, the mid-spreader is one of disposed to or integrally formed with the one or more heat sinks, and the mid-spreader extends beyond a size of at least one of the first circuit board and the second circuit board to conduct and transfer heat therefrom. The electronic device can be a wireless Access Point (AP) that is part of a distributed Wi-Fi system.

The mid-spreader can be electrically connected to ground on each of the first circuit board and the second circuit board. The mid-spreader can be electrically connected to the ground through one or more of a conductive gasket, metal springs, clips, and Foam In Place. The mid-spreader can be electrically connected to the ground through a plurality of points distributed across each side of the mid-spreader. The mid-spreader can be formed to provide an electrical seal for Electromagnetic Interference (EMI) mitigation around a portion of the one or more components. The mid-spreader can be thermally connected to the one or more heat sinks via a plurality of screws, and the mid-spreader is configured to provide mechanical support in the electronic device. The heat conductive material can include one of aluminum, brass, copper, and a ceramic material. The heat conductive material can be coated with a non-corroding surface material to prevent oxidation. Alternatively, if electrical isolation between circuit boards is desired, the heat conductive material can be coated with a material that is electrically non-conducting.

The mid-spreader can be electrically connected to the ground through one or more of a conductive gasket, metal springs or clips, and Foam In Place. The mid-spreader can be electrically connected to the ground through a plurality of points distributed across each side of the mid-spreader. The mid-spreader can be shaped with various indentations based on the associated components, and the mid-spreader can include one or more pedestals to reach short components. The mid-spreader can include indentations and/or pedestals on each side to accommodate associated sizes of the plurality of components on the first circuit board and the second circuit board. The electronic device can further include one or more thermal pads between the first circuit board, the second circuit board, and the mid-spreader. The mid-spreader can be formed from a single casting or stamping. The mid-spreader can be made of non-electrically conducting material, or coated with a non-conducting surface. The mid-spreader can be formed with two or more Electromagnetic Interference (EMI) cavities on one side of the mid-spreader. The mid-spreader can be pre-assembled before manufacturing of the electronic device, including one of attaching foam in place, gaskets, springs, clips, or thermal pads In another exemplary embodiment, a method for an electronic device includes providing a first circuit board and a second circuit board each stacked relative to one another; and providing a mid-spreader disposed between the first circuit board and the second circuit board, wherein the mid-spreader includes a heat conductive material in thermal contact with one or more components on each of the first circuit board and the second circuit board to act as a heat sink, and wherein the mid-spreader is thermally connected to one or more heat sinks, the mid-spreader is one of disposed to or integrally formed with the one or more heat sinks, and the mid-spreader extends beyond a size of each of the first circuit board and the second circuit board to conduct and transfer heat therefrom.

In a further exemplary embodiment, a mid-spreader for use in an electronic device includes a heat conductive material formed in a shape based on a first circuit board and a second circuit board between which the mid-spreader is disposed, wherein the first circuit board and the second circuit board include one or more components in which the heat conductive material is in contact with to act as a heat sink; and one or more thermal connections between the heat conductive material and one or more heat sinks in the electronic device, the mid-spreader is one of disposed to or integrally formed with the one or more heat sinks, and the mid-spreader extends beyond a size of at least one of the first circuit board and the second circuit board to conduct and transfer heat therefrom. The mid-spreader can be formed to provide an electrical seal for Electromagnetic Interference (EMI) mitigation around a portion of the one or more components.

BRIEF DESCRIPTION OF THE DRAWINGS

The present disclosure is illustrated and described herein with reference to the various drawings, in which like reference numbers are used to denote like system components/method steps, as appropriate, and in which:

FIGS. 4-6 are various diagrams of an exemplary mid-spreader such as for use in the Wi-Fi AP of FIGS. 1-3; FIG. 4 is a perspective view, FIG. 5 is a side view, and FIG. 6 is a top view.

DETAILED DESCRIPTION OF THE DISCLOSURE

In various exemplary embodiments, the present disclosure relates to a mid-spreader for stacked circuit boards in an electronic device, such as a Wi-Fi Access Point (AP). In particular, the present disclosure provides a mid-spreader which can address the aforementioned four challenging issues in a small form factor while being cost effective and efficient to produce. The mid-spreader is located between two PCBs within an electronic device and is constructed of a thermally conductive material. To the extent possible, the mid-spreader makes contact with heat generating components on the PCBs, both above and below. To the extent possible, the mid-spreader forms an electrical seal around the PCBs in order to prevent EMI moving from one PCB to the other. The mid-spreader is mechanically sturdy to support both the PCBs. In addition, the mid-spreader connects structurally to any other heat sinks or structural elements within the product.

Figure 1:
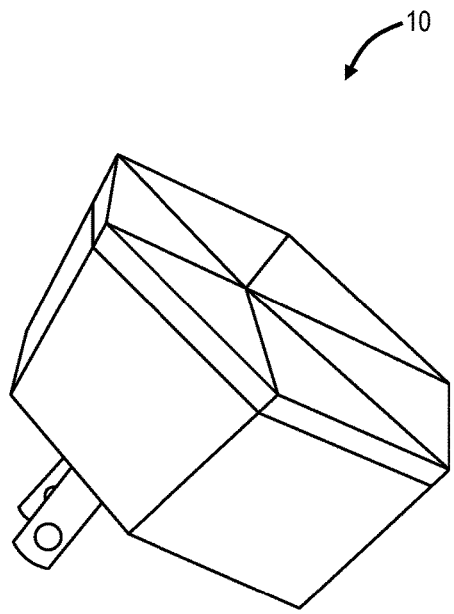
FIG. 1 is a perspective diagram of a Wi-Fi Access Point (AP)

Referring to FIG. 1, in an exemplary embodiment, a perspective diagram illustrates a Wi-Fi Access Point (AP) 10. The Wi-Fi AP 10 is an example of a dense electronic device form factor which can use the mid-spreader described herein. Those skilled in the art will recognize the mid-spreader is described herein with reference to the Wi-Fi AP 10, but other types of electronic devices are also contemplated.

As described herein, Wi-Fi systems are moving towards distributed deployments where multiple Wi-Fi APs 10 are deployed throughout a location in a network topology as opposed to a single, large, high-powered device. An example of the distributed Wi-Fi system and the Wi-Fi AP 10 is provided by the assignee of the present application, Plume Design. With Plume, various Wi-Fi APs 10 are deployed throughout a location (e.g., residence) including 3-10 devices or more. These Wi-Fi APs 10 work together to provide coverage and backhaul using various techniques. However, a key aspect of the physical design is the need to make the Wi-Fi APs 10 small and aesthetically pleasing. In this manner, the Wi-Fi APs 10 can have an extremely small form-factor as shown in FIG. 1. For example, the Wi-Fi APs 10 can have dimensions of about 2.5"×2.3"×1.3" (64 mm×58 mm×34 mm), not including the plug and the Wi-Fi APs 10 can weigh about 3.2 ounces (90 g). The Wi-Fi APs 10 can be designed to directly plug into an electrical outlet and be small enough not to obstruct an adjacent outlet. Thus, the Wi-Fi APs 10 are small as well as have a unique form-factor, i.e., a hexagonal design.

Figure 2:
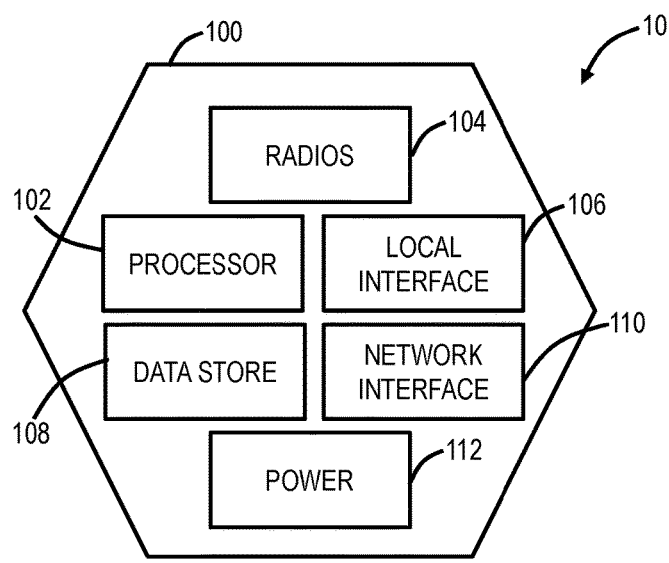
FIG. 2 is a block diagram of functional components of the Wi-Fi AP of FIG. 1.

Referring to FIG. 2, in an exemplary embodiment, a block diagram illustrates functional components of the Wi-Fi AP 10. The Wi-Fi AP 10 includes a physical form factor 100 which contains a processor 102, a plurality of radios 104, a local interface 106, a data store 108, a network interface 110, and power 112. It should be appreciated by those of ordinary skill in the art that FIG. 2 depicts the Wi-Fi AP 10 in an oversimplified manner, and a practical embodiment may include additional components and suitably configured processing logic to support features described herein or known or conventional operating features that are not described in detail herein.

In an exemplary embodiment, the form factor 100 is a compact physical implementation where the Wi-Fi AP 10 directly plugs into an electrical socket and is physically supported by the electrical plug connection to the electrical socket, such as illustrated in FIG. 1. This compact physical implementation is ideal for a large number of Wi-Fi APs 10 distributed throughout a residence. The processor 102 is a hardware device for executing software instructions. The processor 102 can be any custom made or commercially available processor, a central processing unit (CPU), an auxiliary processor among several processors, a semiconductor-based microprocessor (in the form of a microchip or chip set), or generally any device for executing software instructions. When the Wi-Fi AP 10 is in operation, the processor 102 is configured to execute software stored within memory or the data store 108, to communicate data to and from the memory or the data store 108, and to generally control operations of the Wi-Fi AP 10 pursuant to the software instructions. In an exemplary embodiment, the processor 102 may include a mobile-optimized processor such as optimized for power consumption and mobile applications.

The radios 104 enable wireless communication in a distributed Wi-Fi system. The radios 104 can operate according to the IEEE 802.11 standard. The radios 104 include address, control, and/or data connections to enable appropriate communications on the distributed Wi-Fi system. As described herein, the Wi-Fi AP 10 includes a plurality of radios to support different links, i.e., backhaul links (to communicate with other Wi-Fi APs 10) and client links (to communicate with Wi-Fi clients). In an exemplary embodiment, the Wi-Fi APs 10 support dual band operation simultaneously operating 2.4 GHz and 5 GHz 2×2 MIMO 802.11b/g/n/ac radios having operating bandwidths of 20/40 MHz for 2.4 GHz and 20/40/80 MHz for 5 GHz. For example, the Wi-Fi AP 10 can support IEEE 802.11AC1200 Gigabit Wi-Fi (300+867 Mbps).

The local interface 106 is configured for local communication to the Wi-Fi AP 10 and can be either a wired connection or wireless connection such as Bluetooth or the like. Since the Wi-Fi APs 10 can be configured via the cloud, an onboarding process is required to first establish connectivity for a newly turned on Wi-Fi AP 10. In an exemplary embodiment, the Wi-Fi APs 10 can also include the local interface 106 allowing connectivity to a user device for onboarding to the distributed Wi-Fi system such as through an app on the user device. The data store 108 is used to store data. The data store 108 may include any of volatile memory elements (e.g., random access memory (RAM, such as DRAM, SRAM, SDRAM, and the like)), nonvolatile memory elements (e.g., ROM, hard drive, tape, CDROM, and the like), and combinations thereof. Moreover, the data store 108 may incorporate electronic, magnetic, optical, and/or other types of storage media.

The network interface 110 provides wired connectivity to the Wi-Fi APs 10. The network interface 104 may be used to enable the Wi-Fi AP 10 communicate to a modem/router.

Also, the network interface 104 can be used to provide local connectivity to a Wi-Fi client. For example, wiring in a device to a Wi-Fi APs 10 can provide network access to a device which does not support Wi-Fi. In an exemplary embodiment, all of the Wi-Fi APs 10 in the distributed Wi-Fi system includes the network interface 110. In another exemplary embodiment, select Wi-Fi APs 10 which connect a modem/router or require local wired connections have the network interface 110. The network interface 110 may include, for example, an Ethernet card or adapter (e.g., 10BaseT, Fast Ethernet, Gigabit Ethernet, 10 GbE). The network interface 110 may include address, control, and/or data connections to enable appropriate communications on the network.

The processor 102 and the data store 108 can include software and/or firmware which essentially controls the operation of the Wi-Fi AP 10, data gathering and measurement control, data management, memory management, and communication and control interfaces with the cloud. The processor 102 and the data store 108 may be configured to implement the various processes, algorithms, methods, techniques, etc. described herein.

Figure 3:
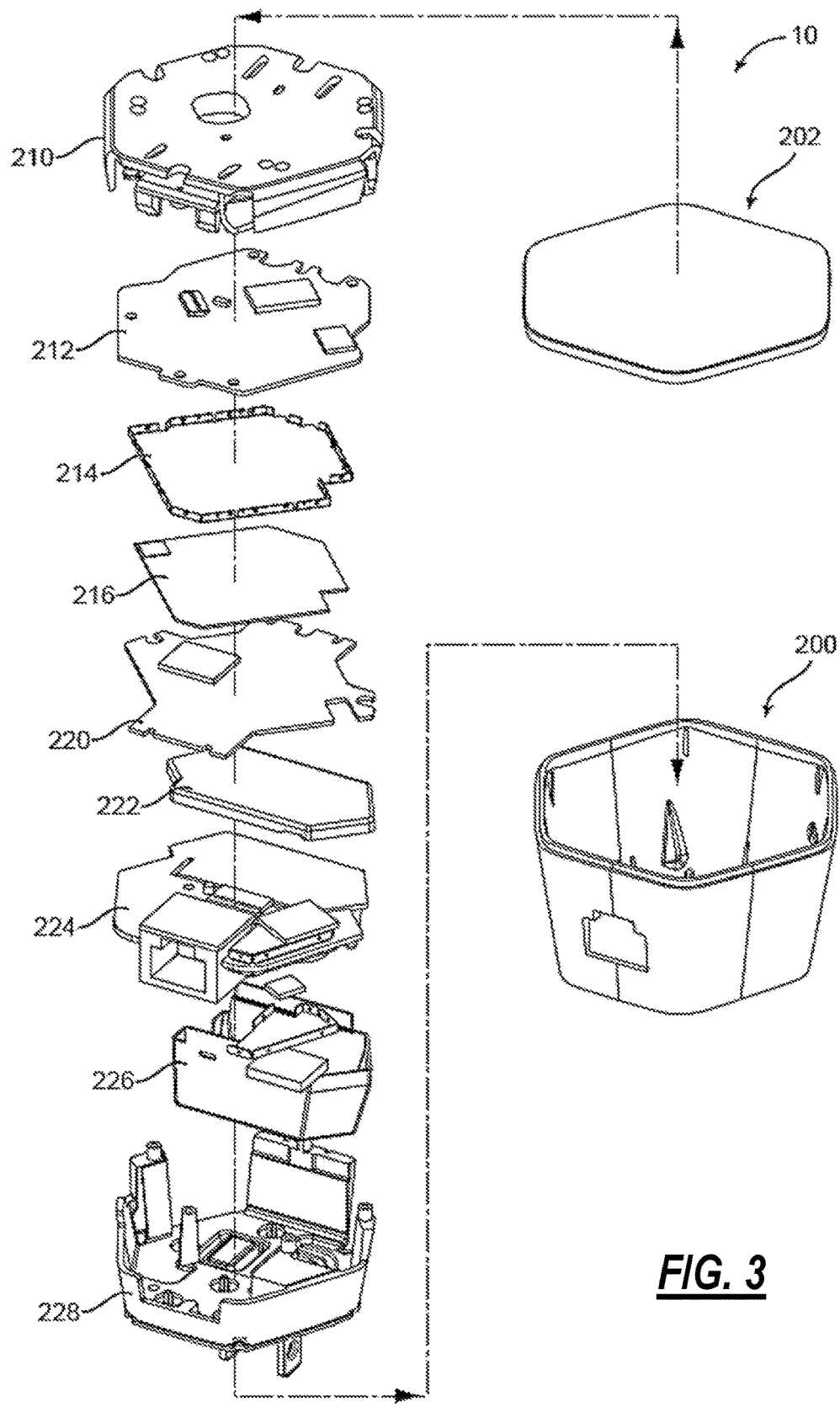
FIG. 3 is a diagram of hardware components of the Wi-Fi AP of FIGS. 2 and 3.

Referring to FIG. 3, in an exemplary embodiment, a diagram illustrates hardware components of the Wi-Fi AP 10. The Wi-Fi AP 10 includes a physical housing with a base 200 and a top 202. Note, the physical housing can have the form-factor in FIG. 1. The various components in the Wi-Fi AP 10 perform the functions described in FIG. 2. The Wi-Fi AP 10 includes an antenna or heat sink assembly 210, a Radio Frequency (RF) PCB 212, an RF shield 214, a thermal pad 216 for the RF shield 214, a mid-spreader 220, an electrically insulating shield 222, a lower PCB 224, in this case holding power and Bluetooth components, an electrically insulating shield 226, and a bottom heat sink assembly 228. Those skilled in the art will recognize the Wi-Fi AP 10 can include other components which are omitted for illustration purposes. The antenna or heat sink assembly 210 can operate as a heat shield and/or antenna. The RF PCB 212 includes RF components and circuitry. The RF shield 214 provides EMI shielding. The thermal pad 216 provides heat spreading/conducting functionality for the RF components. The electrically insulating shields 222, 226 provide isolation for the high voltages in the power supply from the other components and heat sinks in the design. The electrically insulating shields 222, 226 may also hold thermal pads that provide thermal heat conduction for the components on the power PCB 224.

Key to the Wi-Fi AP 10 is the presence of two PCBs 212, 224 in a stacked configuration. Wi-Fi APs (and other electronic devices) are traditionally built with a single PC board. In this case, a heat sink can be located on the top or bottom or both. However, if a smaller size is desired by breaking the board into the two PCBs 212, 224 and stacking them, placing a heat sink at the top of the stack, the bottom of the stack, or both, leaves components in the middle of the stack that have no good heat conduction path. For the two PCB 212, 224 case, this includes components on one side of each of the two PCBs 212, 224.

The mid-spreader 220 is positioned in between the two PCBs 212, 224. An interesting property of the mid-spreader 220 is that a single piece, when designed properly, can contact the components on both PCBs 212, 224 simultaneously at the center of the Wi-Fi AP 10. Therefore, one mid-spreader 220 serves the role of two heat sinks when used in this way.

However, the mid-spreader 220 can face difficulty in conducting the heat to the outside environment if it is entirely confined to the space between the two PCBs 212, 224. For this reason, the mid-spreader 220 is constructed intentionally to extend beyond the size of the PCBs 212, 224 above and below it. In addition, these extensions should be well thermally connected to other larger heat sink areas at the extremities of the physical housing, so as to conduct and transfer heat out of the physical housing.

To function properly, the mid-spreader 220 is constructed of a highly thermally conductive material such as aluminum, brass, copper, or a ceramic material. A ceramic material can be used if it is desired that the mid-spreader 220 provide electrical isolation between the PCBs 212, 224. Another option could be to use a metallic material in the mid-spreader, but coat it with a non-conductive surface material.

More commonly, it is desired that the mid-spreader 220 be electrically conductive and that it makes contact to the ground on the two PCBs 212, 224. In this case, a metal makes a good material for the mid-spreader 220. However, some metals, such as aluminum, can oxidize, leaving a layer that is non-conductive on the surface. In this case, a different coating can be used which will prevent the oxidization and ensure good electrical connection for the life of the product. An example is to put a thin layer of gold over the surfaces that must form a good contact.

Ideally the mid-spreader 220 is in direct physical contact with the heat generating components on the PCBs 212, 224. Unfortunately, different components may be of different heights. In addition, mechanical tolerances may make a perfect fit allowing contact without too much force difficult. There are several solutions to these problems.

First, the mid-spreader 220 does not have to be flat. Rather it can have indentations or pedestals, allowing it to accommodate taller or shorter components. Such shapes are possible to achieve by casting or stamping in some circumstances. Stamping is often preferable as it can be less expensive than casting, and the resulting mid-spreader 220 can have better thermal conductivity. Casting allows shapes that are smaller and more accurate and allows any pillars to be finer and closer to the components. Fairly complicated shapes that would accommodate any number of different height components can be achieved from a single casting or stamping, such that arbitrary, double sided thermal contact can be achieved inexpensively.

Referring to FIGS. 4-6, in an exemplary embodiment, various diagrams illustrate an exemplary mid-spreader 220 such as for use in the Wi-Fi AP 10. Specifically, FIG. 4 is a perspective view, FIG. 5 is a side view, and FIG. 6 is a top view. For example, various indentations 300 can be in the mid-spreader 220 to accommodate different heights of the components. In an exemplary embodiment, the round indentations 300 could accommodate electrolytic capacitors that are taller than other components. That is, the shape of the mid-spreader 220 can be non-uniform based on the associated components on the PCBs 212, 224 so that the mid-spreader 220 can make contact thereto.

In addition to the non-uniform shape, the thermal contact to components can be done with a compliant material, such as a rubber loaded with a thermally conductive material. Such "thermal pads" have a degree of compliance reducing the required mechanical tolerance accuracies in the mid-spreader 220 while providing good heat conduction and direct thermal contact with the components. Such thermal pads can be attached to the mid-spreader 220, or to the components, before assembly to ensure that they are located in the correct place. For example, in FIG. 3, the Wi-Fi AP 10 can include the thermal pad 216 and thermal pads mounted on the electrically insulating shield 222 as thermal pads conducting heat between the mid-spreader 220 and the components on the PCBs 212, 224.

To save the height, board area, expense, and extra assembly steps of a separate EMI shield, it is desirable for the mid-spreader 220 to act as an EMI shield on its own. The key to this is achieving a continuous ring of connection to the ground on the PCBs 212, 224 as best possible around the components that are desired to be isolated. This may involve creating several separate cavities in the mid-spreader 220, each contacting separate ground rings on the PCBs 212, 224 surrounding separate groups of components. For example, in FIGS. 4 and 6, the mid-spreader 220 is shown with two separate cavities.

The connection to the ground ring on the PCB can be achieved by having a pedestal in the shape of the ground ring. Equivalently, the mid-spreader 220 can be stamped or cast with the recess into which the components can fit while the mid-spreader 220 forms electrical contact to the PCB 212, 224 around the outside of the components being isolated. As with the case of the thermal pads, a compliant material can be used to reduce the required mechanical tolerances to form a reliable contact. An example would be a rubbery substance that is loaded with electrically conductive material. Foam in place is an example of such material. This conductive, rubber foam can be applied to the mid-spreader 220 such that it holds in place to the mid-spreader 220 before the mid-spreader 220 is used in assembly. This makes assembly easier. A separate gasket can also be used. Another approach is to use metal springs, tabs, or clips. These metal extensions can be thin and compliant, providing a similar compliance allowing more tolerance in assembly and design. In FIGS. 4 and 6, the pedestal that contacts the PCB 212, 224 forming an EMI ring can be seen, with Foam In Place (FIP) on top of the pedestal to form the electrical contact with some compliance.

An EMI shield works better as it has more ground contacts. Similarly, the circuitry on the PCBs 212, 224 often works better when there are more ground contacts and very low resistance between ground contacts. Therefore, the mid-spreader 220 should typically have as many contacts to ground on the PCBs 212, 224 as practical. In particular, contacting ground only around the outer edge of the mid-spreader 220 may be insufficient. The mid-spreader 220 preferably includes ground contacts throughout the area of the mid-spreader 220, forming a large area and distributed ground network. This can be achieved with the aforementioned techniques of pedestals, gaskets, FIP, etc. It is generally beneficial to have the mid-spreader 220 contact both the PCBs 212, 224 above and below it. The mid-spreader 220 then serves also as a large area ground tie between the two PCBs 212, 224. This usually improves both the EMI isolation and the performance of the circuitry on the PCBs 212, 224.

In some cases, it may be impossible for the mid-spreader 220 to encase a set of components to sufficiently EMI isolate them. In this case, a separate EMI shield may be required such as the RF shield 214. Good thermal contact can still be achieved by placing a thermal pad between the component and the lid of the RF shield 214, and then between that same portion of the RF shield 214 and the mid-spreader 220.

Also, the mid-spreader 220 can be a valuable mechanical support structure for the device, e.g., the Wi-Fi AP 10. It is typically at the center of the device and may have both PCBs 212, 224 attached to it. In fact, if properly designed, no other mechanical frame may be needed. Such proper design includes ensuring the mid-spreader 220 is sufficiently rigid and strong to provide the required mechanical strength for the device. Screws and standoffs, or preferably pedestals built into the mid-spreader 220 can be used to secure the PCBs 212, 224 to the mid-spreader 220. In the case of a product with more than two PCBs 212, 224, multiple mid-spreaders 220 can be used, one between each pair of PCBs 212, 224. If screws are used to connect the mid-spreaders 220, the resulting stack is inherently stable and mechanically strong. In such an assembly, additional metal (heat sinking material) can be provided beyond the mid-spreaders 220 to ensure sufficient surface area for heat dissipation. This can include heat sinks at the very top, bottom, or sides of the device. Direct contact by the heat sinks with the mid-spreaders 220, over as large an area as possible, potentially including screws or other fasteners, is beneficial for conducting the heat from the mid-spreaders to the heat sinks.

Referring now to FIGS. 1-6, in an exemplary embodiment, an electronic device such as the Wi-Fi AP 10 includes a first circuit board 212 and a second circuit board 224 each stacked relative to one another and each including a plurality of components thereon; and a mid-spreader 220 disposed between the first circuit board 212 and the second circuit board 224, wherein the mid-spreader 220 includes a heat conductive material in thermal contact with the plurality of components to act as a heat sink, wherein the mid-spreader 220 is electrically connected to ground on each of the first circuit board 212 and the second circuit board 224, and wherein the mid-spreader 220 is thermally connected to one or more heat sinks, such as the bottom assembly 228. The mid-spreader 220 can be formed to provide an electrical seal for Electromagnetic Interference (EMI) mitigation between the first circuit board 212 and the second circuit board 224. The mid-spreader 220 can be thermally connected to the one or more heat sinks via a plurality of screws and the mid-spreader 220 is configured to provide mechanical support in the electronic device. The heat conductive material can include one of aluminum, brass, copper, and a ceramic material. The heat conductive material can be coated with a non-conductive surface material to prevent oxidation.

The mid-spreader 220 can be electrically connected to the ground through one or more of a conductive gasket, metal springs or clips, and Foam In Place. The mid-spreader 220 can be electrically connected to the ground through a plurality of points distributed across each side of the mid-spreader 220. The mid-spreader 220 can include indentations and/or pedestals on each side to accommodate associated sizes of the plurality of components on the first circuit board 212 and the second circuit board 224. The electronic device can further include one or more thermal pads between the first circuit board 212, the second circuit board 224, and the mid-spreader 220. The mid-spreader 220 can be formed from a single casting or stamping. The mid-spreader 220 can be formed through a cast or through stamping. The mid-spreader 220 can extend beyond a size of each of the first circuit board 212 and the second circuit board 224 to conduct and transfer heat therefrom.

In another exemplary embodiment, a method for an electronic device includes providing a first circuit board and a second circuit board each stacked relative to one another and each including a plurality of components thereon; and providing a mid-spreader disposed between the first circuit board and the second circuit board, wherein the mid-spreader includes a heat conductive material in thermal contact with the plurality of components to act as a heat sink, wherein the mid-spreader is electrically connected to ground on each of the first circuit board and the second circuit board, and wherein the mid-spreader is thermally connected to one or more heat sinks.

In a further exemplary embodiment, a mid-spreader 220 for use in an electronic device includes a heat conductive material formed in a shape based on a first circuit board and a second circuit board between which the mid-spreader is disposed, wherein the first circuit board and the second circuit board can include a plurality of components in which the heat conductive material is in contact with to act as a heat sink; one or more electrical connections between the heat conductive material and ground on each of the first circuit board and the second circuit board; and one or more thermal connections between the heat conductive material and one or more heat sinks in the electronic device. The heat conductive material can include one of aluminum, brass, copper, and a ceramic material. The heat conductive material can be coated with a non-corroding surface material to prevent oxidation, thereby maintaining good electrical contact. Optionally, in the case that electrical contact is not desired, the conductive material can be coated with an electrically non-conductive coating. The mid-spreader can include indentations and/or pedestals on each side to accommodate associated sizes of the plurality of components on the first circuit board and the second circuit board.

In another exemplary embodiment, an electronic device such as the Wi-Fi AP 10 includes a first circuit board 212 and a second circuit board 224 each stacked relative to one another; and a mid-spreader 220 disposed between the first circuit board 212 and the second circuit board 224, wherein the mid-spreader 220 includes a heat conductive material in thermal contact with one or more components on each of the first circuit board 212 and the second circuit board 224 to act as a heat sink, and wherein the mid-spreader 220 is thermally connected to one or more heat sinks, the mid-spreader 220 is one of disposed to or integrally formed with the one or more heat sinks, and the mid-spreader 220 extends beyond a size of at least one of the first circuit board 212 and the second circuit board 224 to conduct and transfer heat therefrom.

Figure 7:
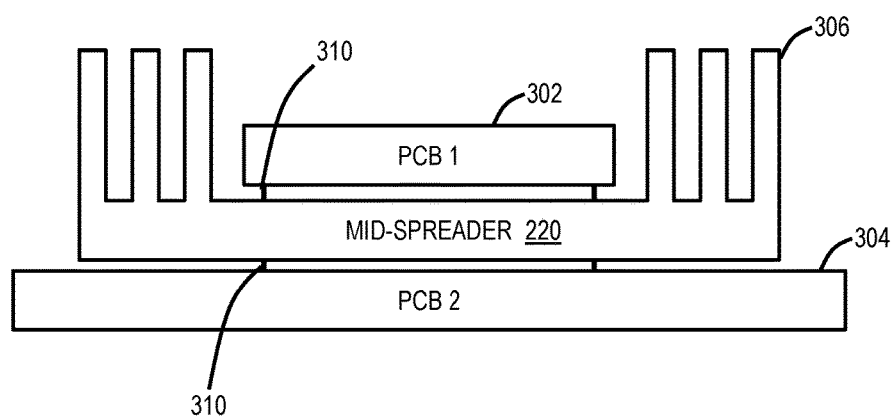
FIG. 7 is a diagram of the mid-spreader extending beyond the size of one Printed Circuit Board (PCB) as well as being integrally formed with a heat sink.

FIG. 7 is a diagram of the mid-spreader 220 extending beyond the size of one PCB 302, 304 as well as being integrally formed with a heat sink 306. The PCB 302 can be either of the circuit boards 212, 224 and the PCB 304 can be the other circuit board 212, 224. The mid-spreader 220 can be thermally connected to the heat sink 306.

The mid-spreader 220 can be electrically connected to ground on each of the first circuit board 212 and the second circuit board 224. The mid-spreader 220 can be electrically connected to the ground through one or more of a conductive gasket, metal springs, clips, and Foam In Place. The mid-spreader 220 is electrically connected to the ground through a plurality of points 310 distributed across each side of the mid-spreader 220. The mid-spreader 220 can be formed to provide an electrical seal for Electromagnetic Interference (EMI) mitigation around a portion of the one or more components. The mid-spreader 220 can be thermally connected to the one or more heat sinks via a plurality of screws and the mid-spreader 220 can be configured to provide mechanical support in the electronic device. The heat conductive material can include one of aluminum, brass, copper, and a ceramic material. The heat conductive material can be coated with a non-corroding surface material 320 to prevent oxidation.

The mid-spreader 220 can be electrically connected to the ground through one or more of a conductive gasket, metal springs or clips, and Foam In Place. The mid-spreader 220 can be electrically connected to the ground through a plurality of points distributed across each side of the mid-spreader 220. The mid-spreader 220 can be shaped with various indentations based on the associated components and the mid-spreader 220 can include one or more pedestals to reach short components. The mid-spreader 220 can include indentations and/or pedestals on each side to accommodate associated sizes of the one or more components on the first circuit board 212 and the second circuit board 224. The electronic device can further include one or more thermal pads between the first circuit board 212, the second circuit board 224, and the mid-spreader 220.

The mid-spreader 220 can be formed from a single casting or stamping. The mid-spreader 220 can be made of non-electrically conducting material, or coated with a non-conducting surface. The mid-spreader 220 can be formed with two or more Electromagnetic Interference (EMI) cavities on one side of the mid-spreader. The mid-spreader 220 can be pre-assembled before manufacturing of the electronic device, including one of attaching foam in place, gaskets, springs, clips, or thermal pads.

In a further exemplary embodiment, a mid-spreader for use in an electronic device includes a heat conductive material formed in a shape based on a first circuit board and a second circuit board between which the mid-spreader is disposed, wherein the first circuit board and the second circuit board include one or more components in which the heat conductive material is in contact with to act as a heat sink; and one or more thermal connections between the heat conductive material and one or more heat sinks in the electronic device, the mid-spreader is one of disposed to or integrally formed with the one or more heat sinks, and the mid-spreader extends beyond a size of at least one of the first circuit board and the second circuit board to conduct and transfer heat therefrom.

With respect to the electronic device, such as the Wi-Fi AP 10, it will be appreciated that the plurality of components described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); power components; RF devices; and the like. Also, the electronic device, such as the Wi-Fi AP 10 can include computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:
1. An electronic device, comprising:
   a first circuit board with Radio Frequency (RF) components and a second circuit board with power components each stacked relative to one another; and a mid-spreader disposed between the first circuit board and the second circuit board, wherein the mid-spreader comprises a heat conductive material in thermal contact with one or more components on each of the first circuit board and the second circuit board to act as a heat sink, wherein the mid-spreader is formed with indentations and has a shape to provide for Electromagnetic Interference (EMI) mitigation around a portion of the one or more components, and wherein the mid-spreader is formed with two or more Electromagnetic interference (EMI) cavities on one side of the mid-spreader facing the first circuit board, and wherein the mid-spreader is thermally connected to one or more heat sinks, the mid-spreader is integrally formed with the one or more heat sinks, and the mid-spreader extends beyond a size of at least one of the first circuit board and the second circuit to conduct and transfer heat therefrom.

2. The electronic device of claim 1, wherein the mid-spreader is electrically connected to ground on each of the first circuit board and the second circuit board.

3. The electronic device of claim 2, wherein the mid-spreader is electrically connected to the ground through one or more of a conductive gasket, metal springs, clips, and formed in place material.

4. The electronic device of claim 2, wherein the mid-spreader is electrically connected to the ground through a plurality of points distributed across each side of the mid-spreader.

5. The electronic device of claim 1, wherein the mid-spreader is thermally connected to the one or more heat sinks and the mid-spreader is configured to provide mechanical support in the electronic device.

6. The electronic device of claim 1, wherein the heat conductive material comprises one of aluminum, brass, copper, and a ceramic material.

7. The electronic device of claim 1, wherein the heat conductive material is coated with a non-corroding surface material to prevent oxidation.

8. The electronic device of claim 1, wherein the mid-spreader is electrically connected to the ground through one or more of a conductive gasket, metal springs or clips, and formed in place material.

9. The electronic device of claim 1, wherein the mid-spreader is electrically connected to the ground through a plurality of points distributed across each side of the mid-spreader.

10. The electronic device of claim 1, wherein the mid-spreader is shaped with various indentations based on the associated components.

11. The electronic device of claim 1, wherein the mid-spreader comprises indentations and/or pedestals on each side to accommodate associated sizes of the one or more components on the first circuit board and the second circuit board.

12. The electronic device of claim 1, further comprising: one or more thermal pads between the first circuit board, the second circuit board, and the mid-spreader.

13. The electronic device of claim 1, wherein the mid-spreader is formed from a single casting or stamping.

14. The electronic device of claim 1, wherein the mid-spreader is made of non-electrically conducting material, or coated with a non-conducting surface.

15. The electronic device of claim 1, wherein the mid-spreader is pre-assembled before manufacturing of the electronic device, including one of attaching formed in place material, gaskets, springs, clips, or thermal pads.

16. A method for an electronic device, comprising:

providing a first circuit board with Radio Frequency (RF) components and a second circuit board with power components each stacked relative to one another; and providing a mid-spreader disposed between the first circuit board and the second circuit board, wherein the mid-spreader comprises a heat conductive material in thermal contact with one or more components on each of the first circuit board and the second circuit board to act as a heat sink, wherein the mid-spreader is formed with indentations and has a shape to provide for Electromagnetic Interference (EMI) mitigation around a portion of the one or more components, and wherein the mid-spreader is formed with two or more Electromagnetic Interference (EMI) cavities on one side of the mid-spreader facing the first circuit board, and wherein the mid-spreader is thermally connected to one or more heat sinks, the mid-spreader is integrally formed with the one or more heat sinks, and the mid-spreader extends beyond a size of at least one of the first circuit board and the second circuit.

17. A mid-spreader for use in an electronic device, comprising:

a heat conductive material formed in a shape based on a first circuit board with Radio Frequency (RF) components and a second circuit board with power components between which the mid-spreader is disposed, wherein the second circuit board comprises one or more components in which the heat conductive material is in contact with to act as a heat sink, wherein the shape is formed with indentations and the shape provides for Electromagnetic interference (EMI) mitigation around a portion of the one or more components, and wherein the mid-spreader is formed with two or more Electromagnetic Interference (EMI) cavities on one side of the mid-spreader facing the first circuit board; and one or more thermal connections between the heat conductive material and one or more heat sinks in the electronic device, the mid-spreader is integrally formed with the one or more heat sinks, and the mid-spreader extends beyond a size of at least one of the first circuit board or the second circuit board to conduct and transfer heat therefrom.

* * * * *